(12) United States Patent
Leifso et al.

(10) Patent No.: US 6,870,425 B2
(45) Date of Patent: Mar. 22, 2005

(54) SYSTEM AND METHOD OF AMPLIFIER GAIN CONTROL BY VARIABLE BIAS AND DEGENERATION

(75) Inventors: Curtis R. Leifso, Kanata (CA); Samuel A. Tiller, Ottawa (CA)

(73) Assignee: Research in Motion Limited, Waterloo (CA)

( * ) Notice: Subject to any disclaimer, the term of this patent is extended or adjusted under 35 U.S.C. 154(b) by 0 days.

(21) Appl. No.: 10/414,780

(22) Filed: Apr. 16, 2003

(65) Prior Publication Data

US 2003/0193370 A1 Oct. 16, 2003

Related U.S. Application Data

(60) Provisional application No. 60/372,449, filed on Apr. 16, 2002.

(51) Int. Cl.[7] ................................................ H03F 3/45
(52) U.S. Cl. ........................ 330/254; 330/278; 330/283
(58) Field of Search ............................. 330/129, 254, 330/260, 278, 283

(56) References Cited

U.S. PATENT DOCUMENTS 4,866,314 A * 9/1989 Traa ........................... 327/278
6,163,215 A * 12/2000 Shibata et al. .............. 330/254
6,674,327 B2 * 1/2004 Harberts ..................... 330/254
6,684,065 B2 * 1/2004 Bult et al. ................... 330/254

* cited by examiner

Primary Examiner—Khanh V. Nguyen
(74) Attorney, Agent, or Firm—Jones Day; Krishna K. Pathiyal; Robert C. Liang

(57) ABSTRACT

A gain control circuit that permits a variable gain amplifier circuit to operate with high input linearity and low power consumption is disclosed. The variable gain amplifier includes a standard differential bipolar transistor input circuit and a pair of degeneration transistors connected to a current source transistor. The gain control circuit provides a variable degeneration control voltage to vary the effective resistance of the degeneration transistors and a variable bias voltage to vary the current of the current source transistor. The input linearity of the variable gain amplifier is controlled independently of gain by adjusting the effective resistance and the current in an inverse relationship such that at maximum gain the current is at a maximum while the degeneration resistance is at a minimum, and at minimum gain the current is at a minimum while the degeneration resistance is at a maximum. Therefore the variable gain amplifier can be controlled to operate with high input linearity and low power at lower ranges of gain.

17 Claims, 7 Drawing Sheets

SYSTEM AND METHOD OF AMPLIFIER GAIN CONTROL BY VARIABLE BIAS AND DEGENERATION

CROSS-REFERENCE TO RELATED APPLICATIONS

The present application claims priority to U.S. Provisional Application No. 60/372,449 filed on Apr. 16, 2002, the contents of which are, by reference, incorporated herein in their entirety

FIELD OF THE INVENTION

The present invention generally relates to variable gain amplifier control circuits. More specifically, the present invention relates to gain control techniques for a.c. (Alternating Current), IF (Intermediate Frequency), and RF (Radio Frequency) signals.

BACKGROUND OF THE INVENTION

Variable gain amplifier circuits are commonly used in the electronics and semiconductor industry for automatic gain control applications, voltage control filters, automatic signal levelling for A/D amplitude modulation and variable gain transimpedance, for example. Commercial devices in which variable gain circuits are used extensively include personal digital assistants (PDAs), mobile communication devices, cellular phones, and wireless two-way data communications devices, collectively referred to herein as mobile devices.

FIG. 1 shows a circuit schematic of a typical variable gain amplifier circuit. Variable gain amplifier (VGA) circuit 10 includes a load stage 12, a differential input stage 14, a degeneration stage 16 and a current source 18 connected in series between a first voltage supply such as VDD and a second voltage supply such as VSS or ground. A first current branch of amplifier circuit 10 consists of resistor 20, n-type bipolar transistor 24 and n-type degeneration transistor 28. A second current branch of amplifier circuit 10 consists of resistor 22, n-type bipolar transistor 26 and n-type degeneration transistor 30, where the resistors, bipolar transistors and degeneration transistors are identical to each other. VGA circuit 10 receives a pair of input signals IN+ and IN− at the base terminal of bipolar transistors 24 and 26 respectively for providing a pair of output signals OUT− and OUT+ at the collector terminals of bipolar transistors 24 and 26 respectively. A degeneration voltage signal DCTRL is connected to both gate terminals of degeneration transistors 28 and 30 for adjusting their effective channel resistance. A bias voltage VBIAS connected to the gate of n-type transistor 18 controls the total current flowing through VGA circuit 10. The voltage gain of the output signals OUT− and OUT+ relative to the input signals IN+ and IN− depends on the ratio of the load resistance and the resistance of the degeneration transistors 28 and 30. More specifically, VG=Rload/Rdegen, where VG is the voltage gain, Rload is the load resistor value and Rdegen is the resistance value of the degeneration transistors. Therefore, by controlling the gate to source voltage of the degeneration transistors 28 and 30 via DCTRL, their effective channel resistance Rdegen can be changed, and thus the gain of VGA circuit 10 can be varied. Although not shown in FIG. 1, a gain control circuit sets the desired gain of VGA circuit 10 through signal DCTRL.

An important and practical criteria of VGA circuit 10 is its ability to provide a wide gain range. Therefore it follows that the resistance of the degeneration transistors 28 and 30 must vary over a wide range. However, design requirements demand that the input linearity of the VGA circuit improve as the gain is lowered. Hence, if the circuit is biased at a fixed tail current by transistor 18 via VBIAS, the range of degeneration resistance is severely limited by bias considerations. If the tail current is kept constant, i.e Vbias= constant, then low gain is achieved by lowering DCTRL to increase Rdegen. A problem with this solution is that the large voltage drop across Rdegen cause voltage headroom limitations for the typical low supply voltages that are used in low power applications. More specifically, as the resistance of the degeneration transistors 28 and 30 increases, the voltage drop across them increases proportionally. Eventually the bias conditions of bipolar transistors 24 and 26 of the differential input stage 14 will no longer be satisfied, and as a result, will begin to turn off. Furthermore, degeneration transistors 28 and 30 dissipate relatively high amounts of power during low gain operation since the effective degeneration transistor resistance and current through the constant current source transistor is high. Since most VGA circuits operate normally at gain levels significantly lower than maximum gain, high power consumption results. Thus, gain of the circuit can be controlled over a wide input signal dynamic range, but at the expense of linearity and/or power, making the VGA circuit 10 prior amplifier control techniques an unacceptable solution in low power/high linearity applications.

It is, therefore, desirable to provide a VGA circuit and controller that provides gain control with high linearity and low power consumption without sacrificing dynamic range.

SUMMARY OF THE INVENTION

It is an object of the present invention to obviate or mitigate at least one disadvantage of previous load management systems. In particular, it is an object of the invention to provide an automatic gain control circuit for controlling input linearity of a variable amplifier.

In a first aspect, the present invention provides an automatic gain control circuit for controlling input linearity of a variable amplifier in response to a control voltage. The control circuit includes a current steering circuit, a load control circuit and a degeneration circuit. The current steering circuit provides first and second bias control voltages in response to the control voltage level. The load control circuit receives the first and second bias control voltages from the current steering circuit, and provides a load control voltage for varying a load of the variable amplifier directly with a change in gain. The degeneration control circuit receives the first and second bias control voltages from the current steering circuit, and provides a degeneration control voltage for adjusting a resistance of a degeneration circuit inversely with the change in gain.

According to an embodiment of the present aspect, the current steering circuit includes an op amp circuit for receiving the control voltage and a temperature feedback voltage for providing a temperature adjusted control voltage, and a temperature control circuit for receiving the temperature adjusted control voltage for providing the temperature feedback voltage.

In an aspect of the present embodiment, the current steering circuit includes a current source connected to VDD, a differential pair of p-channel transistors for receiving the current source at their shared drain terminals, where one of the p-channel transistors receives the temperature adjusted control voltage and the other of the p-channel transistors receives a reference voltage, a first diode connected n-channel transistor connected between the source terminal of one of the p-channel transistor and VSS for providing the first bias control voltage, and a second diode connected n-channel transistor connected between the source terminal of the other p-channel transistor and VSS for providing the second bias control voltage.

In yet a further aspect of the present embodiment, the temperature control circuit includes a temperature dependent bias current source connected to VDD, a differential pair of p-channel reference transistors and a resistor. The differential pair of p-channel reference transistors receives the temperature dependent bias current source at their shared drain terminals, where one of the p-channel reference transistors receives the temperature adjusted control voltage and has its source terminal connected to VSS, and the other of the p-channel reference transistors receives the reference voltage. The resistor is connected between the source terminal of the other p-channel reference transistor and VSS, where the temperature feedback voltage is provided by the source terminal of the other p-channel reference transistor.

In another embodiment of the present aspect, the degeneration circuit includes a reference load circuit, a reference input transistor, a reference degeneration transistor and a reference current source, a voltage divider circuit and a comparator circuit. The reference load circuit, reference input transistor, reference degeneration transistor and reference current source are serially connected between VDD and VSS for replicating bias conditions of the variable amplifier. The reference input transistor receives a bias voltage, the reference degeneration transistor receives the degeneration control voltage and the reference current source receives the first bias control voltage. The voltage divider circuit receives the voltage of the drain terminal of the reference degeneration transistor for providing a divided voltage adjustable by the second bias control voltage. The comparator circuit receives the divided voltage and the voltage of the source terminal of the reference degeneration transistor for providing the degeneration control voltage.

In alternate aspects of the present embodiment, a voltage follower op-amp circuit has an input for receiving the drain terminal of the reference degeneration transistor, for providing an output to the voltage divider. The voltage divider circuit includes a resistance element and an n-channel transistor serially connected between the output of the voltage follower op-amp circuit and VSS, the n-channel transistor being controlled by the second bias control voltage.

In another embodiment of the present aspect, the load control circuit includes a voltage divider reference circuit, a voltage divider feedback circuit, and a comparator circuit. The voltage divider reference circuit provides a reference voltage adjustable by the first bias control voltage. The voltage divider feedback circuit provides a feedback voltage adjustable by the second bias control voltage and a load control voltage. The comparator circuit receives the reference voltage and the feedback voltage for providing the load control voltage, where the load control voltage increases the load of the variable amplifier as gain decreases.

In an aspect of the present embodiment, the load control circuit includes a diode connected p-channel transistor and an n-channel transistor connected serially between VDD and VSS for providing the load control voltage from the source terminal of the diode connected p-channel transistor. The n-channel transistor receives the first bias control voltage for adjusting the voltage level of the load control voltage, where the control voltage increases the load of the variable amplifier as gain increases.

In a second aspect, the present invention provides a degeneration control circuit for controlling degeneration transistors of a variable amplifier circuit in response to first and second bias control voltages. The degeneration control circuit includes a reference load circuit, a reference input transistor, a reference degeneration transistor, a reference current source, a voltage divider circuit, and a comparator circuit. The reference load circuit, reference input transistor, reference degeneration transistor and reference current source are serially connected between VDD and VSS for replicating bias conditions of the variable amplifier. The reference input transistor receives a bias voltage, the reference degeneration transistor receives a degeneration control voltage and the reference current source receives the first bias control voltage. The voltage divider circuit receives the voltage of the drain terminal of the reference degeneration transistor for providing a divided voltage adjustable by the second bias control voltage. The comparator circuit receives the divided voltage and the voltage of the source terminal of the reference degeneration transistor for providing the degeneration control voltage.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

A gain control circuit that permits a variable gain amplifier circuit to operate with high input linearity and low power consumption is disclosed. The variable gain amplifier includes a standard differential bipolar transistor input circuit and a pair of degeneration transistors connected to a current source transistor. The gain control circuit provides a variable degeneration control voltage to vary the effective resistance of the degeneration transistors and a variable bias voltage to vary the current of the current source transistor. The input linearity of the variable gain amplifier is controlled independently of gain by adjusting the effective resistance and the current in an inverse relationship such that at maximum gain the current is at a maximum while the degeneration resistance is at a minimum, and at minimum gain the current is at a minimum while the degeneration resistance is at a maximum. Therefore the variable gain amplifier can be controlled to operate with high input linearity and low power at lower ranges of gain.

Figure 2:
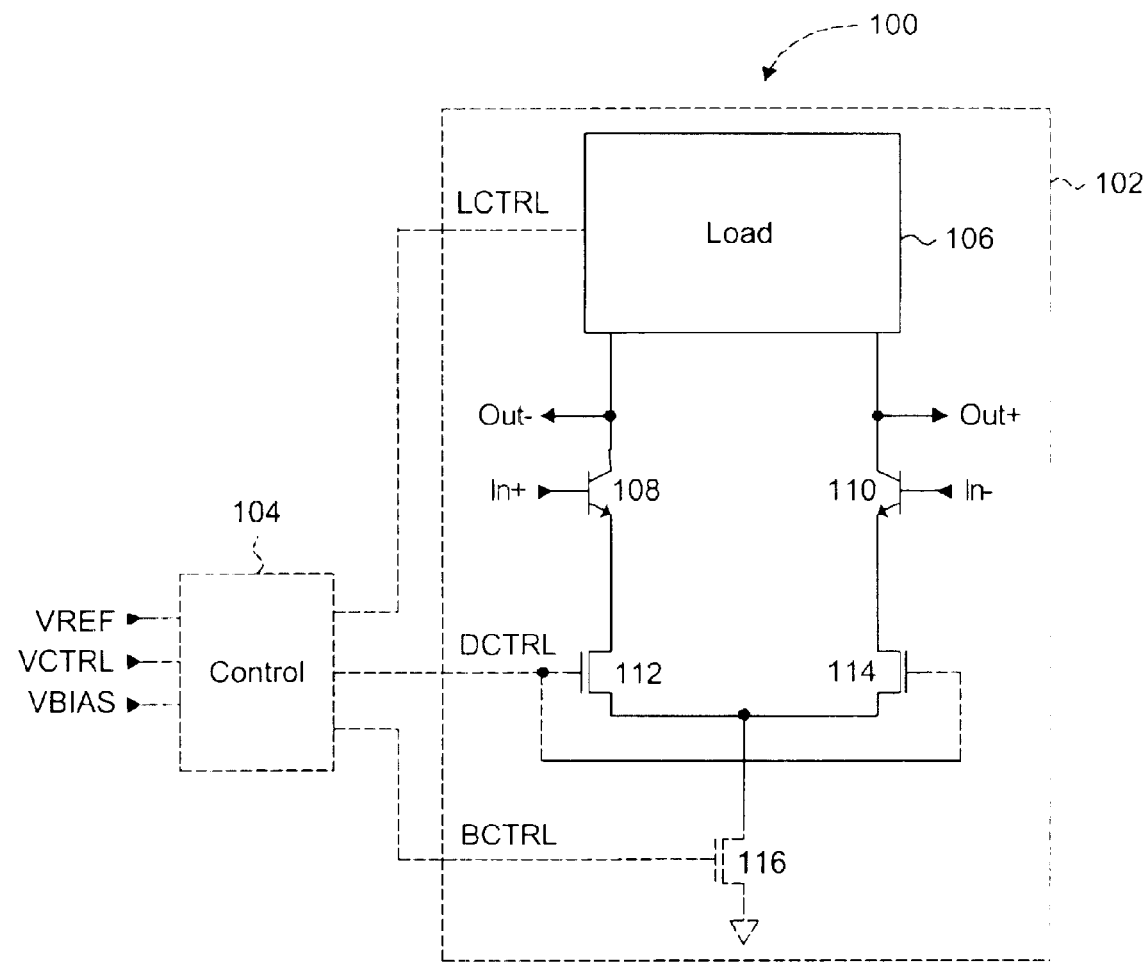
FIG. 2 shows a block diagram illustrating a Variable Bias Degeneration Automatic Gain Control system in accordance with an embodiment the present invention.

FIG. 2 is a block diagram of a Variable Bias Degeneration Automatic Gain Control system (VBDAGC) according to an embodiment of the present invention. VBDAGC system 100 includes a variable gain amplifier (VGA) circuit 102 and a gain control circuit 104. The gain control circuit 104 simultaneously controls the variable amplifier degeneration resistance and current using an inverse relationship. As the degeneration resistance increases, the current decreases to ensure that the bias conditions are satisfied at all times. Thus, at high gain, the current is at its maximum while the degeneration resistance is at a minimum. Similarly, as the degeneration resistance is increased toward the maximum, the current is reduced to its minimum.

Variable gain amplifier 102 includes a load circuit 106 coupled to output terminals Out− and Out+, and to the collector terminals of input stage bipolar transistors 108 and 110. Load circuit 106 receives load control signal LCTRL for controlling the load upon transistors 108 and 110. The base terminals of bipolar transistors 108 and 110 receive input signals In+ and In− respectively, and their emitter terminals are connected to the drain terminals of degeneration transistors 112 and 114 respectively. The gate terminals of transistors 112 and 114 receive degeneration voltage DCTRL for adjusting their effective resistance. The common source terminals of transistors 112 and 114 are coupled to VSS through current source transistor 116. Current source transistor 116 receives current source bias voltage BCTRL for adjusting the current through VGA circuit 102. Gain control circuit 104 receives a reference voltage VREF, a bias voltage VBIAS, and a control voltage VCTRL, for providing voltage signals LCTRL, DCTRL and BCTRL. Generally, gain control circuit 104 adjusts the voltage levels of LCTRL, DCTRL and BCTRL in accordance with the voltage level of VCTRL relative to VREF to provide a desired gain for VGA circuit 102. VGA circuit 102 can then amplify input signals In+ and In− and drive the resulting amplified signals on output terminals Out− and Out+ with the desired gain.

To achieve high input linearity and low power at low gain, the voltage level of DCTRL is decreased to increase the degeneration resistance of transistors 112 and 114, and the voltage level of BCTRL is decreased to decrease the current through the circuit. Control of this relationship between DCTRL and BCTRL is automatic in response to the voltage level of VCTRL. Furthermore, the voltage level of LCTRL is also adjusted to compensate for parasitic capacitance across the channels of degeneration transistors 112 and 114 at low gain. The automatic control of DCTRL, BCTRL and LCTRL is discussed in further detail with respect to FIGS. 3–7.

Figure 3:
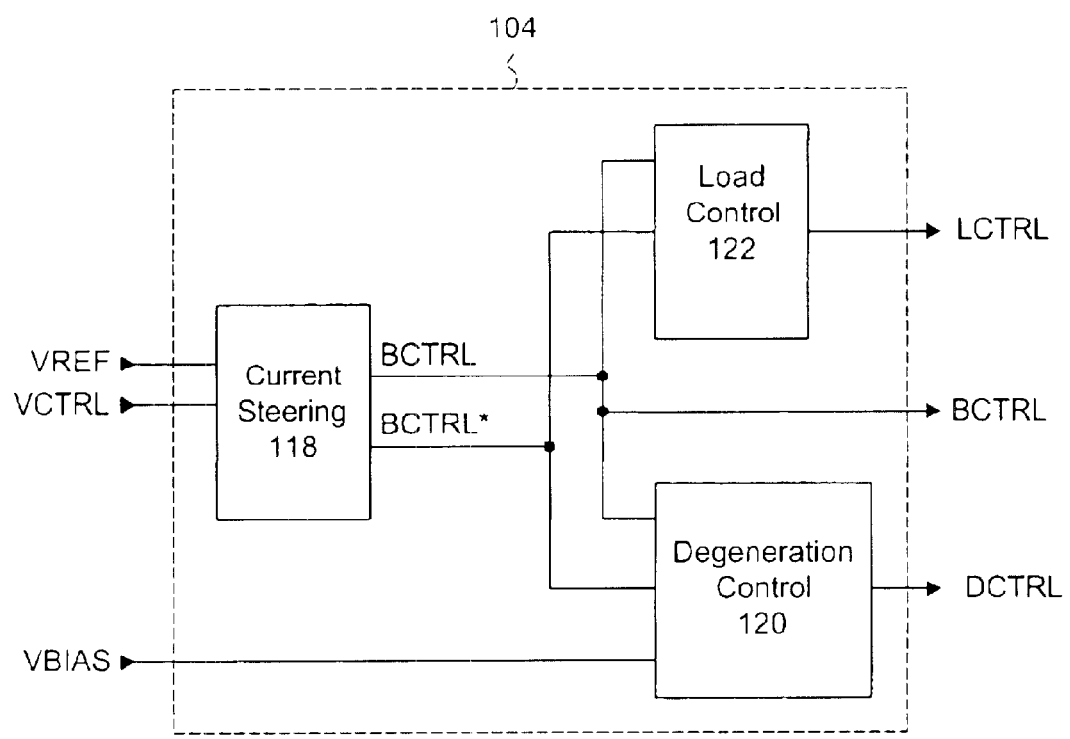
FIG. 3 shows a block diagram illustrating functional blocks of the gain control circuit shown in FIG. 2.

FIG. 3 is a block diagram of the gain control circuit 104 shown in FIG. 2. Gain control circuit 104 receives reference voltage VREF, bias voltage VBIAS and user defined control voltage VCTRL, for providing variable gain amplifier voltages LCTRL, BCTRL and DCTRL. Gain control circuit 104 includes a current steering circuit 118, a degeneration control circuit 120 and a load control circuit 122. Current steering circuit 118 receives VREF and VCTRL for providing differential voltages BCTRL and BCTRL*. Degeneration control circuit 120 receives differential voltages BCTRL and BCTRL* and VBIAS for providing DCTRL. Load control circuit 122 receives differential voltages BCTRL and BCTRL* for providing LCTRL. The general relationship between voltages VCTRL, LCTRL, BCTRL and DCTRL is now discussed. VCTRL is a user defined voltage level that sets the desired gain of VGA circuit 102 from FIG. 2. The current steering circuit 118 compares the level of VCTRL to the predefined VREF level and adjusts the levels of differential voltages BCTRL and BCTRL* corresponding to the difference between VCTRL and VREF. In this particular example, if VCTRL is higher than VREF, then BCTRL will have a level higher than BCTRL*. Conversely, BCTRL will have a level lower than BCTRL* if VCTRL is lower than VREF. Degeneration control circuit 120 then adjusts DCTRL in accordance with the levels of BCTRL and BCTRL*, and in particular BCTRL since this voltage controls current source 116 of VGA circuit 102 in FIG. 2. More specifically, the voltage level of DCTRL will vary in a direct relationship with the voltage level change of BCTRL. In otherwords, if BCTRL increases for high gain operation, then DCTRL will also increase to reduce the VGA circuit degeneration resistance. Voltage LCTRL has a direct relationship with BCTRL, such that during low gain operation where BCTRL decreases, LCTRL decreases to reduce the effective load resistance of load circuit 106 in FIG. 2. Each of current steering circuit 118, degeneration control circuit 120 and load control circuit 122 will now be discussed in further detail.

Figure 4:
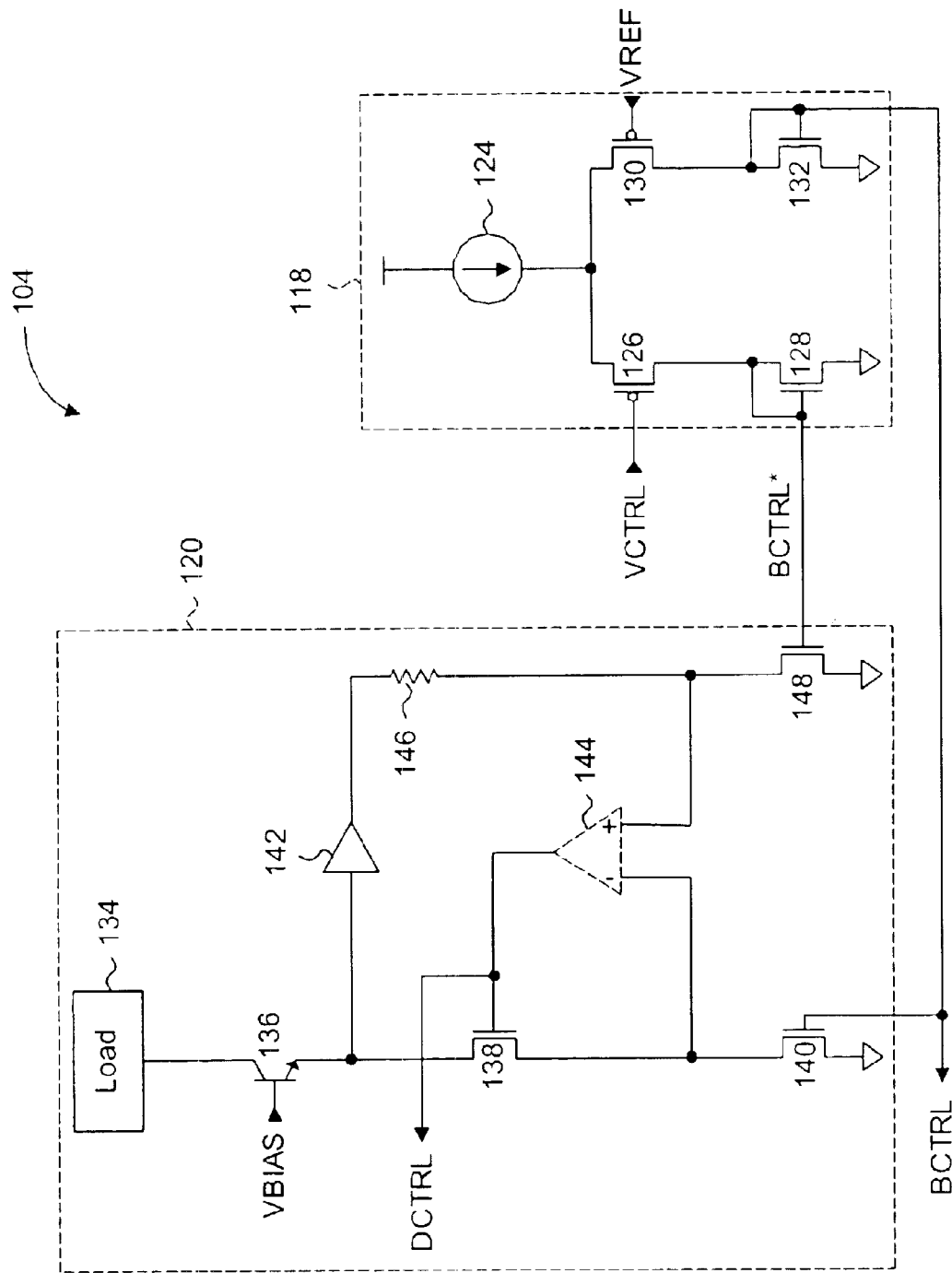
FIG. 4 is a circuit schematic of the current steering block and the degeneration control block shown in FIG. 3.

FIG. 4 is a circuit schematic of a portion of gain control circuit 104, illustrating the circuits for current steering circuit 118 and degeneration control circuit 120 according to an embodiment of the present invention. The load control circuit 122 of FIG. 3 is not shown to simplify the schematic. Current steering circuit 118 includes a differential pair consisting of p-channel transistors 126 and 130, having a common drain terminal connected to a current source 124 and gate terminals connected to receive VCTRL and VREF respectively. Transistors 126 and 130 are connected to diode connected n-channel current mirror transistors 128 and 132 respectively. Differential voltages BCTRL and BCTRL* are provided from the gates of diode connected transistors 128 and 132 respectively. Current steering circuit 118 is well known in the art. Degeneration control circuit 120 includes a reference circuit that mimics a current branch of VGA circuit 102 (see FIG. 2). This reference, or replica, circuit includes reference load circuit 134, reference bipolar input transistor 136, reference degeneration transistor 138 and a reference current source 140, serially connected between VDD and VSS to replicate the bias conditions in VGA circuit 102. In a presently preferred embodiment, the components in the reference circuit are scaled down to save power and reduce the area occupied by the reference circuit. However, those of skill in the art should understand that the more the reference components deviate from the actual VGA size, the less accurately the degeneration resistance in the replica will track the desired degeneration resistance. Thus, the actual scaling factor is determined by the particular application requirements. Input transistor 136 receives VBIAS on its base terminal and the gate of transistor 140 receives BCTRL from current steering circuit 118. The emitter terminal of transistor 136 is connected to an input of voltage follower op amp 142, which in turn has its output connected to a resistance element, such as fixed resistor 146. The other terminal of resistor 146 is connected to the drain terminal of transistor 148, which receives BCTRL* at its gate terminal. Resistor 146 and transistor 148 form a voltage divider circuit that divides the voltage received from op-amp 142, and provides a divided voltage to comparator circuit 144, also known as an op-amp. The level of the divided voltage can be adjusted by the level of BCTRL*. Op amp 144 has its inputs connected to the drain terminals of transistors 140 and 148 for driving DCTRL and its output connected to the gate of transistor 138. Transistor 140 and transistor 132 are arranged in a current mirror configuration, as are transistors 148 and 128. The general operation of the current steering circuit 118 and the degeneration control circuit 120 are now described.

In current steering circuit 118, an increase in the voltage level of VCTRL, relative to VREF, increases current flow through transistor 130 and thus in transistors 132 and 140, while less current flows in transistors 126, 128 and 148. Therefore the voltage level of BCTRL* decreases and the voltage level of BCTRL increases. In the present example, an increase in VCTRL relative to VREF increases the desired gain of VGA circuit 102, and correspondingly, a decrease in VCTRL relative to VREF decreases the desired gain.

For any increase in BCTRL, degeneration control circuit 120 ensures a corresponding increase in DCTRL. Op amp 142 drives the first terminal of resistor 146 to a voltage level that is the same as the drain terminal of replica degeneration transistors 138 and hence degeneration resistance varies proportionally in 112 and 114 in VGA circuit 102. The voltage across resistor 146 is a product of the current in transistor 148 and the resistance of degeneration resistor 146. Op amp 144 adjusts the gate voltage of transistor 138 such that its drain-source voltage is the same as the voltage drop across resistor 146, regardless of the current in transistor 138. Therefore changing the current in transistors 140 or 148 can change the channel resistance of transistor 138 through op amp 144. For example, if the current in transistor 148 is decreased while increasing the current in transistor 140, the current in transistor 138 is increased while the voltage drop across it decreases to reduce its channel resistance. Since the VGA circuit bias mimics that of transistors 136, 138 and 140, the VGA circuit degeneration resistance is also lowered and the gain increases. Naturally, the gain can be decreased by reducing the current in transistor 140 and increasing the current in transistor 148.

Current steering circuit 118 provides gain limits as well as stabilizing the inherently variable channel resistance of transistor 138. The maximum gain is determined by the maximum current available, which is determined by the bandgap stabilized Iref value, Iref of current source 124. At maximum gain, the current of VGA circuit 102 is n*Iref where n is the scaling factor between the components of VGA circuit 102 and the reference circuit of degeneration control circuit 120. Hence at maximum gain, no current flows in transistors 126, 128 and 148 and the voltage across the transistor 138 is the same as the voltage across resistor 146, in this case zero. The gain is determined by the transconductance (gm) of the differential pair at the given current. More specifically, the actual $1^{st}$ order gain evaluation is G=(gm*RL)/(1+Redgen) So, when Rdegen is >1, G~RL/Rdegen. For high gain Rdegen is set to equal 0, therefore G becomes gm*RL. At minimum gain, the voltage across resistor 146 is maximized and the current through transistor 140 is close to zero. Although the absolute minimum gain is less well controlled, the circuit does ensure that the bias conditions are not violated by limiting the voltage drop across degeneration resistor 146. In the practical range of gain control, the gain will be a function of the ratio of the degeneration transistor resistance and load resistances. Since the degeneration resistance is related to degeneration resistor 146, and the same type of resistor is used in load circuit 106, the gain variation can then be reduced to about 1%–3%, which is the matching error between resistors. The gain variation due to absolute process variation of both the degeneration transistors and the degeneration resistor is greater than 20%.

In summary, gain control circuit 104 controls the degeneration resistance and the current of VGA circuit 102 in an indirectly proportional relationship. More specifically, gain control circuit 104 reduces the resistance of degeneration transistors 112 and 114 and increases the current in current source 116 of VGA circuit 102 as the desired gain is increased via control voltage VCTRL. In the present example, desired gain is increased when VCTRL is increased relative to VREF. Conversely, gain control circuit 102 increases the resistance of degeneration transistors 112 and 114 and decreases the current in current source 116 of VGA circuit 102 as the desired gain is decreased.

Figure 5:
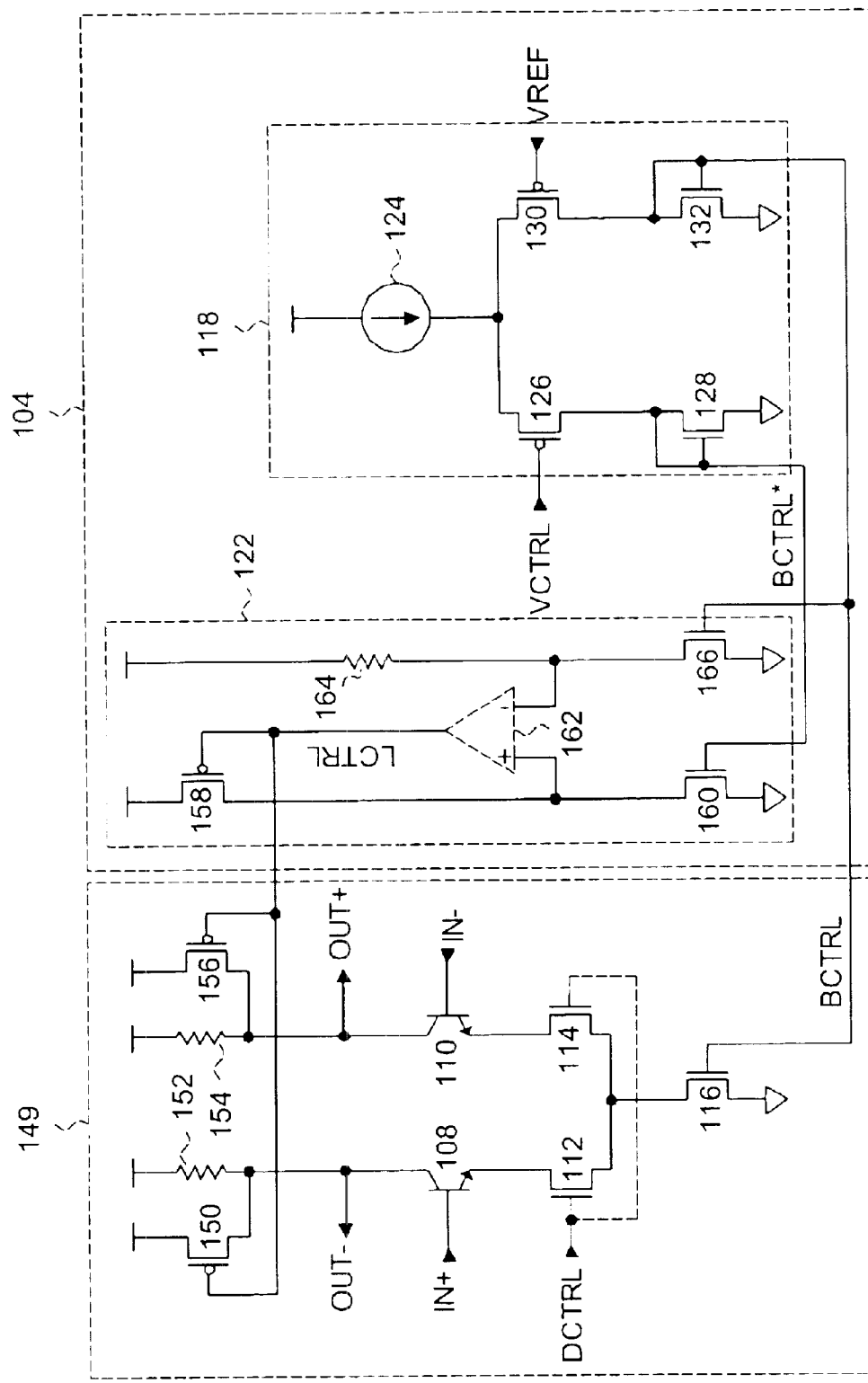
FIG. 5 is a circuit schematic of the current steering block and the load control block shown in FIG. 3 connected to a variable gain amplifier according to an embodiment of the present invention.

FIG. 5 is a circuit schematic of a portion of gain control circuit 104 for low gain operation, illustrating the circuits for current steering circuit 118 and load control circuit 122 according to an embodiment of the present invention. A circuit embodiment of VGA circuit 102 from FIG. 2 is also shown in FIG. 5 to illustrate the advantage afforded by load control circuit 122. It is noted that BCTRL and BCTRL* are also connected to the previously described degeneration control circuit, which is not shown to simply the schematic. VGA circuits that use degeneration transistors have an inherent problem where the parasitic capacitance across the channel of the degeneration transistors shunts the resistance and limits the range of low gain operation. Load control circuit 122 is configured to automatically reduce the load resistance of the VGA circuit as the gain is reduced. The circuits of FIG. 5 are now described, with the exception of the current steering circuit 118 because it is identical to the same numbered circuit shown in FIG. 4.

Figure 1:
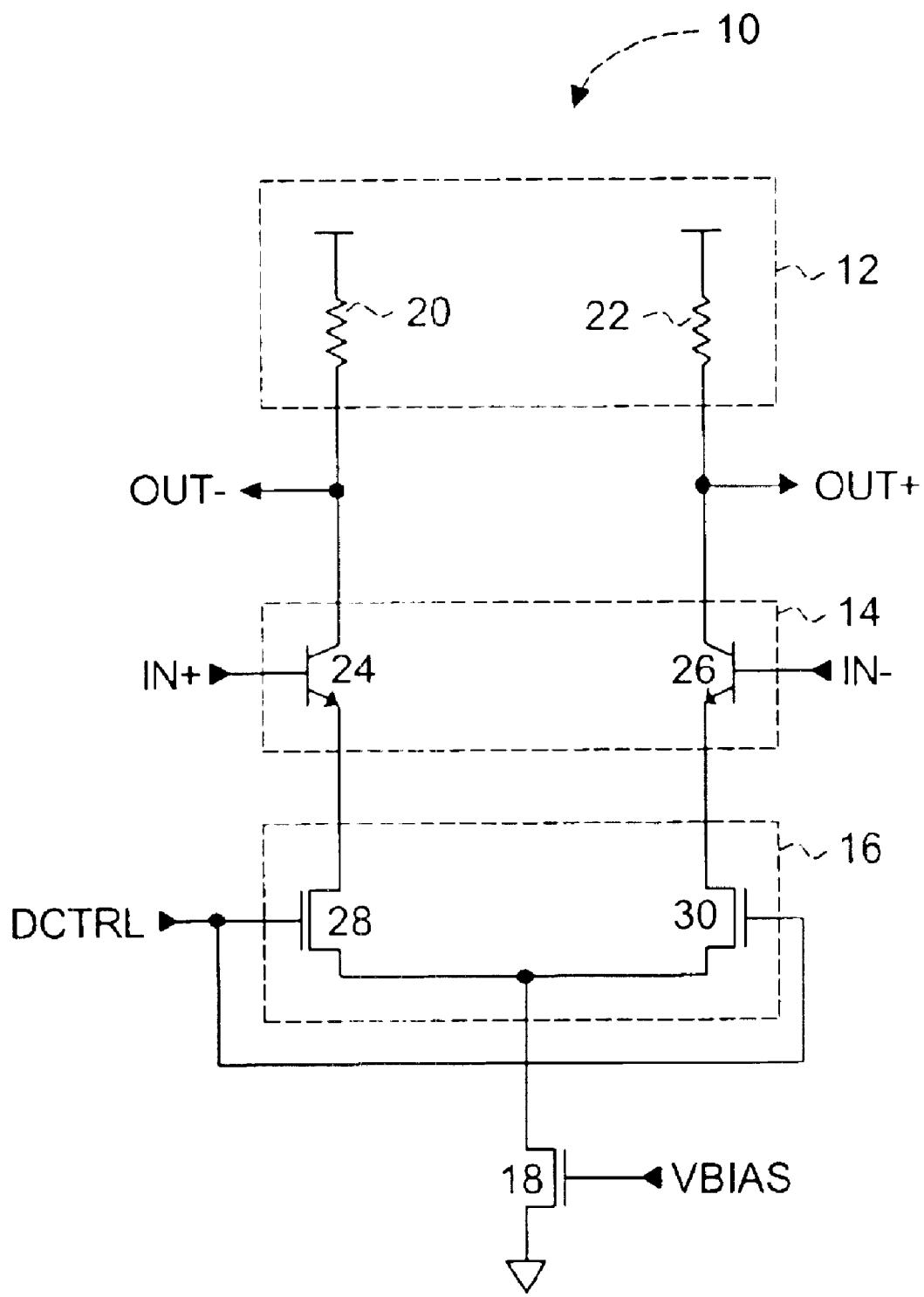
FIG. 1 shows a circuit schematic of a conventional variable gain amplifier circuit of the prior art.

VGA circuit 149 includes a first current branch having load resistor 152, bipolar input transistor 108 and degeneration transistor 112 connected in series between VDD and the drain terminal of current source transistor 116. A second current branch includes load resistor 154, bipolar input transistor 110 and degeneration transistor 114 serially connected between VDD and the drain terminal of current source transistor 116. It will be apparent to those of skill in the art that the aforementioned components are configured identically to the components of VGA circuit 10 shown in FIG. 1. VGA circuit 149 further includes p-channel load shunting transistors 150 and 156 coupled in parallel to their respective load resistors 152 and 154. The gate terminals of load shunting transistors 150 and 156 receive load control voltage LCTRL for adjusting their channel resistance. VGA circuit 149 also receives degeneration control voltage DCTRL provided by degeneration control circuit 120 at the gate terminals of degeneration transistors 112 and 114, and current source bias voltage BCTRL provided by current steering circuit 118 at the gate terminal of current source transistor 116.

Load control circuit 122 includes a voltage divider feedback circuit, a comparator circuit and a voltage divider feedback circuit. The voltage divider feedback circuit includes a p-channel feedback transistor 158 and an n-channel current mirror transistor 160 serially connected between VDD and VSS for providing a reference voltage. The gate terminal of transistor 158 is connected to the output of op amp 162, and the gate terminal of transistor 160 receives BCTRL* from current steering circuit 118. The voltage divider reference circuit includes a resistor 164 and n-channel current mirror transistor 166 serially connected between VDD and VSS, where the gate terminal of transistor 166 receives BCTRL. Comparator circuit 162, or more specifically op amp 162, has its inputs connected to the drain terminals of current mirror transistors 160 and 166 for driving LCTRL with a voltage level corresponding to the voltage drop across resistor 164. Because current mirror transistors 160 and 166 mirror the current in transistors 128 and 132 respectively of bias steering circuit 118, LCTRL will decrease as VCTRL decreases with the desired gain. Therefore by decreasing LCTRL, the channel resistance of load shunting transistors 150 and 156 is decreased to lower the effective load provided by resistors 152 and 154. During low gain operation, the current through transistor 160 will increase and the current through transistor 166 will decrease, forcing op amp 162 to drive LCTRL with a voltage level below VDD, which is sufficient to turn on load shunting transistors 150 and 156. By lowering the effective load resistance as the gain is reduced, the limitations imposed by the shunt capacitance of the degeneration transistors 112 and 114 are overcome.

In some applications the VGA circuit, such as VGA circuit 102 from FIG. 2, is required to provide high voltage with as small current as possible. In general, increasing the load resistance is a valid method for increasing the voltage gain for a given current. However, the voltage bias conditions which will allow linear operation of the VGA circuit should be maintained, and the value of resistance is limited by the current used. During maximum gain operation when the degeneration resistance is significantly reduced, the gain is also set by the transconductance of the input stage bipolar transistors, hence the gain is proportional to current. Accordingly, as current is increased the load resistance should be reduced to maintain linear bias conditions, but the product of current and load resistance is roughly constant at maximum gain.

Figure 6:
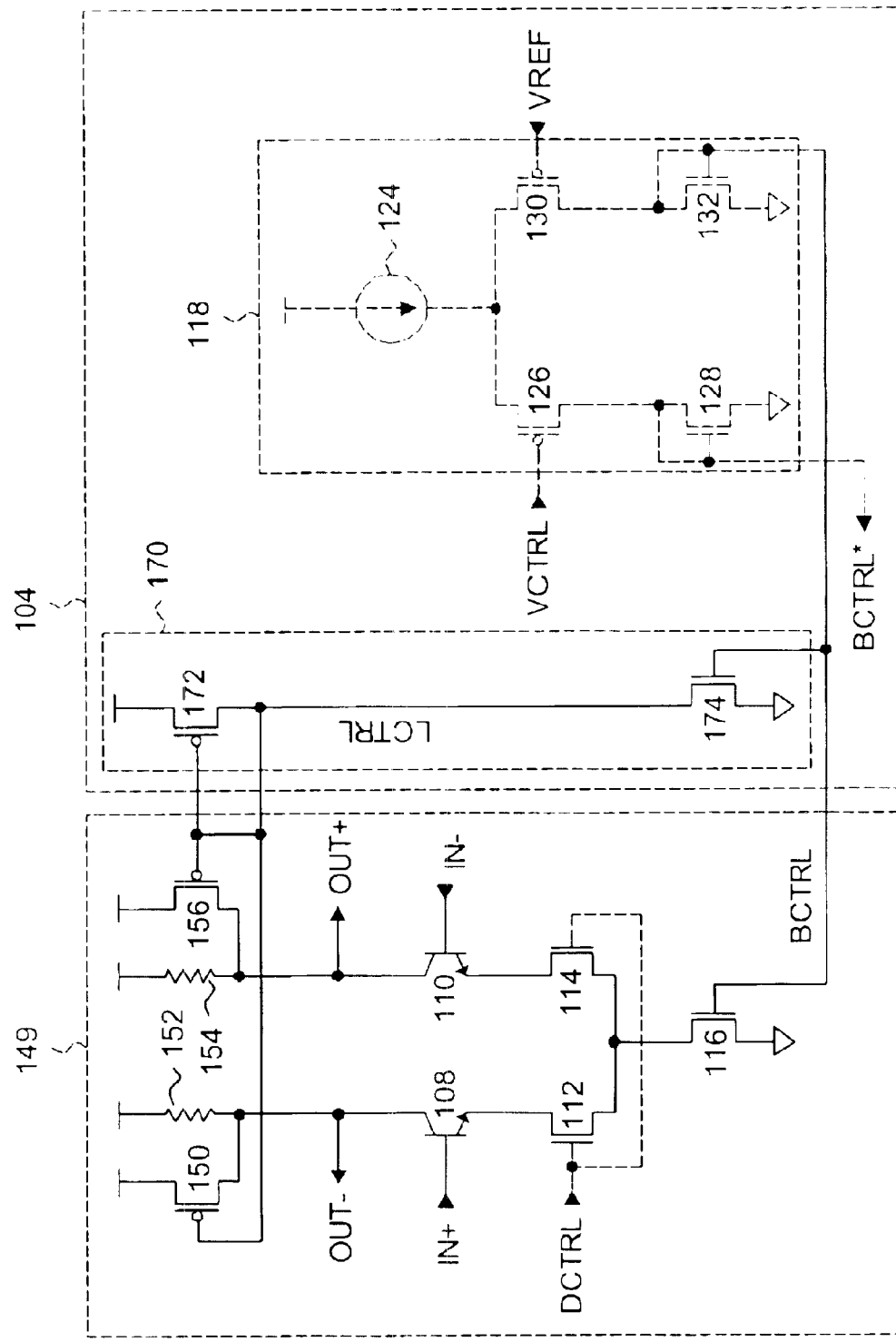
FIG. 6 is a circuit schematic of the circuits of FIG. 5 with an alternate load control block according to an embodiment of the present invention; and, FIG. 7 is a circuit schematic of an alternate current steering circuit according to an embodiment of the present invention.

FIG. 6 is a circuit schematic of a portion of gain control circuit 104 for high gain operation, illustrating the circuits for current steering circuit 118 and DC current source load bypass circuit 170 according to an embodiment of the present invention. The present embodiment reduces the effective load resistance of the VGA circuit as the current of the circuit is maximized during maximum gain operation.

This is achieved through the use of a pair of controlled shunt current sources in parallel to the load resistors of the VGA circuit to source the required dc current while maintaining high AC impedance. The shunt current sources are controlled by DC current source load bypass circuit 170, which incidentally can replace load control circuit 122 of FIG. 3. It is noted that VGA circuit 149 of FIG. 6 is the same circuit from FIG. 5, and BCTRL and BCTRL* are also connected to the previously described degeneration control circuit, which is not shown to simply the schematic. Since current steering circuit 118 and VGA circuit 149 have been described in the previous embodiments of the present invention, it is not necessary to describe them again. DC current source load bypass circuit 170 includes a diode connected p-channel transistor 172 and an n-channel transistor 174 serially connected between VDD and VSS. The gate terminal of transistor 172 is connected to the gates of p-channel load shunting transistors 150 and 156 of VGA circuit 149, and the gate terminal of transistor 174 is connected to BCTRL from current steering circuit 118. Voltage level LCTRL is provided from the source terminal of transistor 172. Transistor 174 mirrors a fraction of the bias current in transistor 116 through diode connected transistor 172. Shunting transistors 150 and 156 act as current mirrors and supply some DC current to input transistors 108 and 110 while maintaining the relatively high impedance of current sources. During high gain operation, BCTRL is increased to increase the current in VGA circuit 149. As BCTRL increases, the voltage level of LTCRL decreases, hence reducing the channel resistance of load shunting transistors 150 and 156 and the effective load of load resistors 152 and 154. The presently disclosed embodiment of FIG. 6 balances the shunted current which should be as high as possible for maximum gain, allowing for the use of a large resistor, with the need to drop enough voltage across the load to ensure voltage compliance on the positive and negative maximum output swings.

As previously mentioned, at maximum gain the degeneration transistors 112 and 114 of VGA circuit 149 are reduced to an effective resistance of zero Ohms, and the gain is determined by the gm of the input stage bipolar transistors 108 and 110. At a constant bias current, the gm of the input stage bipolar transistors 108 and 110 changes with temperature and is approximately proportional to the inverse of the absolute temperature. This translates to approximately +/−2 dB of variation over a simulated temperature range between −40 to +100 degrees C. It is possible to meet the minimum required maximum gain by increasing the current at room temperature such that the drop at 100 degrees C. is still within acceptable limits. However, this technique wastes current since the device is nominally operated near room temperature. A more elegant solution is the use of a bias current which is proportional to absolute temperature or PTAT. The AGC uses a combination of constant and PTAT sources to stabilize the gain over the entire control and temperature range. For example, current source 124 can be implemented as a constant current source in parallel with a PTAT source to overcome gain losses at high temperatures.

Figure 7:
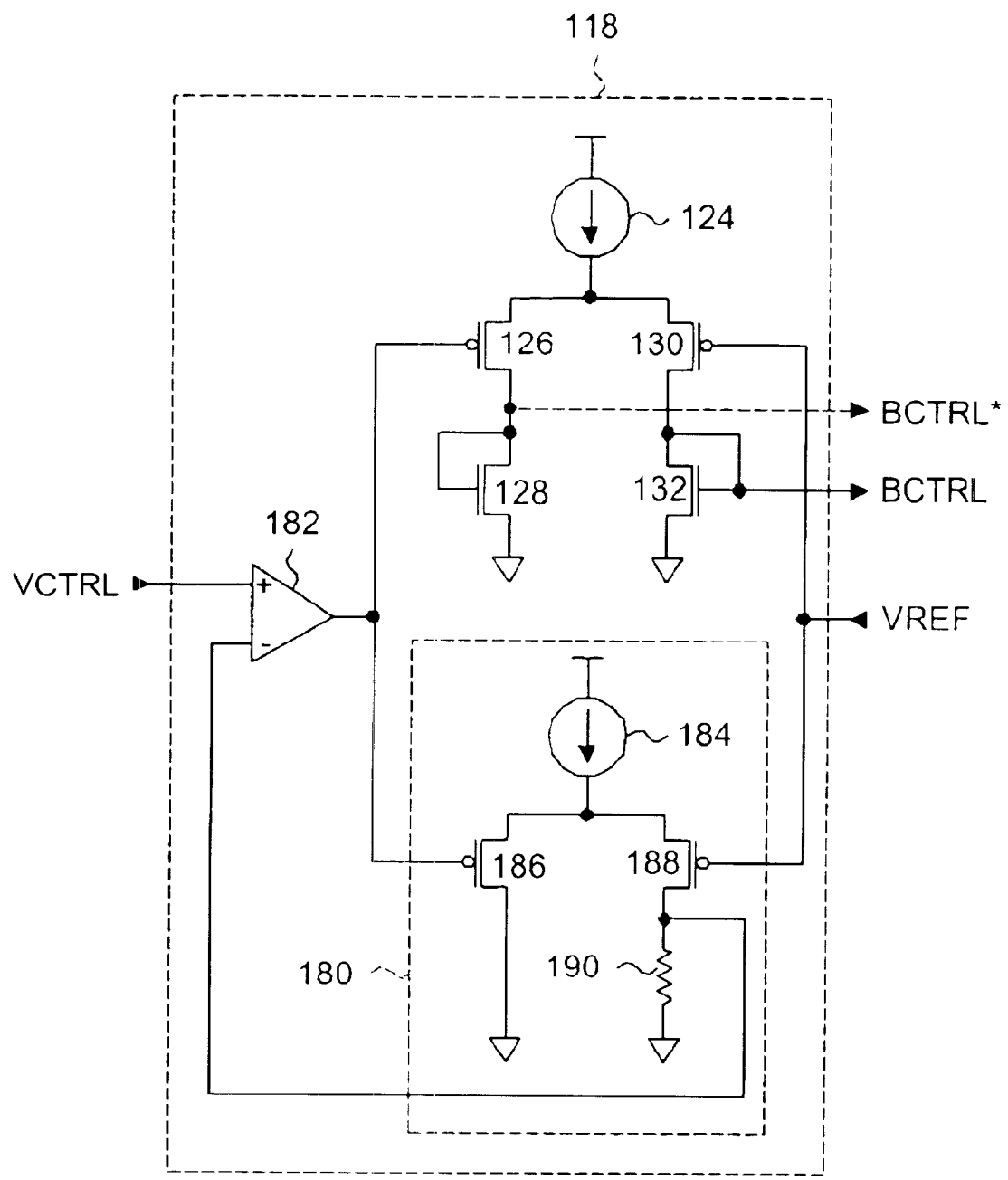

FIG. 7 is a circuit schematic of an alternate current steering circuit for stabilizing gain over temperature according to an embodiment of the present invention. Alternate current steering circuit 118 includes a differential pair consisting of p-channel transistors 126 and 130, having a common drain terminal connected to a constant current source 124. The gate terminal of transistor 126 is connected to the output of op amp 182, and the gate terminal of transistor 130 is connected to reference voltage VREF. Transistors 126 and 130 are connected to diode connected n-channel current mirror transistors 128 and 132 respectively. Differential voltages BCTRL and BCTRL* are provided from the gates of diode connected transistors 128 and 132 respectively. It is noted that elements 124, 126, 130, 128 and 132 are the same as discussed in FIGS. 4–6. PTAT control circuit 180 is a scaled version of the steering differential pair of transistors 126/130 and used in a feedback loop to fix the current steering ratio. PTAT control circuit 180 includes a pair of p-channel PTAT steering reference transistors 186 and 188 having a common drain terminal connected to a temperature dependent bias current source 184. The source terminal of transistor 186 is connected to ground, and the source terminal of transistor 188 is coupled to ground via resistor 190. The gate terminal of transistor 186 is connected to the output of op amp 182 and the gate terminal of transistor 188 is connected to reference voltage VREF. The output of op amp 182 provides a temperature adjusted control voltage to transistors 126 and 186, and the source terminal of transistor 188 provides a temperature feedback voltage. PTAT steering transistors are scaled versions of steering transistors 126 and 130 respectively. Op amp 182 has one input connected to control voltage VCTRL and a second input connected to the source terminal of transistor 188 for receiving the temperature feedback voltage.

In operation, the circuit of FIG. 7 functions such that the gate voltage on transistor 186 is adjusted by the op amp 182 until the voltages at resistor 190 and the control voltage VCTRL are equal. Now the current ratio of the feedback devices can be accurately controlled by virtue of the scaling factor of transistors 186 and 188 relative to transistors 126 and 130. The current ratio of the current of transistor 126 versus total current is given as VCTRL/(I190×Iconstant), where I190 is the current through resistor 190 and Iconstant is the current provided by constant current source 124.

The described embodiments of the gain control circuit of the present invention ensure that DC conditions of a VGA circuit are satisfied to keep the differential input transistors on. Furthermore, high input linearity control and gain control independent of temperature is achieved by the embodiments of the present invention.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. An automatic gain control circuit for controlling input linearity of a variable amplifier in response to a control voltage, the control circuit comprising:
   a current steering circuit for providing first and second bias control voltages in response to the control voltage level;
   a load control circuit for receiving the first and second bias control voltages from the current steering circuit, and for providing a load control voltage for varying a load of the variable amplifier directly with a change in gain; and
   a degeneration control circuit for receiving the first and second bias control voltages from the current steering circuit and providing a degeneration control voltage for adjusting a resistance of a degeneration circuit inversely with the change in gain.

2. The control circuit of claim 1, wherein the current steering circuit includes
   an op amp circuit for receiving the control voltage and a temperature feedback voltage, for providing a temperature adjusted control voltage, and
   a temperature control circuit for receiving the temperature adjusted control voltage, for providing the temperature feedback voltage.

3. The control circuit of claim 2, wherein the current steering circuit includes
   a current source connected to VDD,
   a differential pair of p-channel transistors for receiving the current source at their shared drain terminals, one of the p-channel transistors receiving the temperature adjusted control voltage and the other of the p-channel transistors receiving a reference voltage,
   a first diode connected n-channel transistor connected between the source terminal of one of the p-channel transistor and VSS for providing the first bias control voltage, and
   a second diode connected n-channel transistor connected between the source terminal of the other p-channel transistor and VSS for providing the second bias control voltage.

4. The control circuit of claim 3, wherein the temperature control circuit includes
   a temperature dependent bias current source connected to VDD,
   a differential pair of p-channel reference transistors for receiving the temperature dependent bias current source at their shared drain terminals, one of the p-channel reference transistors receiving the temperature adjusted control voltage and having its source terminal connected to VSS, and the other of the p-channel reference transistors receiving the reference voltage, and
   a resistor connected between the source terminal of the other p-channel reference transistor and VSS, the temperature feedback voltage being provided by the source terminal of the other p-channel reference transistor.

5. The control circuit of claim 1, wherein the degeneration circuit includes
   a reference load circuit,
   a reference input transistor,
   a reference degeneration transistor and a
   reference current source serially connected between VDD and VSS, for replicating bias conditions of the variable amplifier, the reference input transistor receiving a bias voltage, the reference degeneration transistor receiving the degeneration control voltage and the reference current source receiving the first bias control voltage,
   a voltage divider circuit for receiving the voltage of the drain terminal of the reference degeneration transistor and for providing a divided voltage adjustable by the second bias control voltage, and
   a comparator circuit for receiving the divided voltage and the voltage of the source terminal of the reference degeneration transistor for providing the degeneration control voltage.

6. The control circuit of claim 5, wherein a voltage follower op-amp circuit has an input for receiving the drain terminal of the reference degeneration transistor, for providing an output to the voltage divider.

7. The control circuit of claim 6, wherein the voltage divider circuit includes a resistance element and an n-channel transistor serially connected between the output of the voltage follower op-amp circuit and VSS, the n-channel transistor being controlled by the second bias control voltage.

8. The control circuit of claim 1, wherein the load control circuit includes
   a voltage divider reference circuit for providing a reference voltage adjustable by the first bias control voltage,
   a voltage divider feedback circuit for providing a feedback voltage adjustable by the second bias control voltage and a load control voltage, and,
   a comparator circuit for receiving the reference voltage and the feedback voltage for providing the load control voltage, the load control voltage increasing the load of the variable amplifier as gain decreases.

9. The control circuit of claim 1, wherein the load control circuit includes a diode connected p-channel transistor and an n-channel transistor connected serially between VDD and VSS for providing the load control voltage from the source terminal of the diode connected p-channel transistor, the n-channel transistor receiving the first bias control voltage for adjusting the voltage level of the load control voltage, the control voltage increasing the load of the variable amplifier as gain increases.

10. A degeneration control circuit for controlling degeneration transistors of a variable amplifier circuit in response to first and second bias control voltages, the degeneration control circuit comprising:

a reference load circuit, a reference input transistor, a reference degeneration transistor and a reference current source serially connected between VDD and VSS, for replicating bias conditions of the variable amplifier, the reference input transistor receiving a bias voltage, the reference degeneration transistor receiving a degeneration control voltage and the reference current source receiving the first bias control voltage, a voltage divider circuit for receiving the voltage of the drain terminal of the reference degeneration transistor and for providing a divided voltage adjustable by the second bias control voltage, and a comparator circuit for receiving the divided voltage and the voltage of the source terminal of the reference degeneration transistor for providing the degeneration control voltage.

11. A method of controlling the gain of a variable amplifier, the variable amplifier having an amplifier coupled to a bias current source by a degeneration resistance, the method comprising the steps of:

a) varying the degeneration resistance;

b) varying the bias current source;

c) providing a scaled replica of at least a portion of the variable amplifier, the scaled replica including a scaled portion of the amplifier, a scaled portion of the degeneration resistance, and a scaled bias current source each having a corresponding scaled signal; and d) feeding back at least one scaled signal to vary either the degeneration resistance or bias current;

thereby controlling the gain of the variable amplifier.

12. The method of claim 11 further wherein the steps of varying the bias current source and of varying the degeneration resistance are effected in opposite directions so that an increase in one quantity implies that the other quantity stays constant or decreases.

13. The method of claim 11 wherein the variable amplifier includes a resistive load, the method further comprising the step of varying the resistive load thereby further controlling the gain of the amplifier.

14. The method of claim 12 wherein the variable amplifier is electrically coupled to a known impedance, the method further comprising the step of varying the degeneration resistance in proportion to a function of the bias current and the known impedance, the function selected from at least one of a group of functions including: $Rd \sim (1-i)$, $Rd \sim 1/i$ and $Rd \sim (1-i)/i$ where i represents a normalized current relative to a current maximum, and Rd represents the degeneration resistance; thereby further controlling the gain of the variable amplifier with high linearity.

15. The method of claim 11 further comprising the step of varying the degeneration resistance such that the resistance is substantially constant over a first range of bias current; and the resistance decreases over a second range of bias current.

16. The method of claim 15 wherein the start of the first range of bias current is smaller than the start of the second range of bias current.

17. A method of controlling the gain of a variable amplifier, the variable amplifier having an amplifier coupled to a bias current source by a degeneration resistance and also coupled to a known impedance, the method comprising the steps of:

varying the bias current source; and varying the degeneration resistance in proportion to a function of the bias current and the known impedance, the function selected from at least one of a group of function including: $Rd \sim (1-i)$, $Rd \sim 1/i$ and $Rd \sim (1-i)/i$ where i represents a normalized current relative to a current maximum, and Rd represents the degeneration resistance.

* * * * *